United States Patent
Dillon et al.

(10) Patent No.: US 7,216,323 B2
(45) Date of Patent: May 8, 2007

(54) PROCESS FOR DESIGNING BASE PLATFORMS FOR IC DESIGN TO PERMIT RESOURCE RECOVERY AND FLEXIBLE MACRO PLACEMENT, BASE PLATFORM FOR ICS, AND PROCESS OF CREATING ICS

(75) Inventors: Michael N. Dillon, Richfield, MN (US); Christopher J. Tremel, St. Louis Park, MN (US); Scott A. Peterson, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 250 days.

(21) Appl. No.: 10/976,518

(22) Filed: Oct. 29, 2004

(65) Prior Publication Data

US 2006/0095880 A1 May 4, 2006

(51) Int. Cl.
*G06F 17/50* (2006.01)
(52) U.S. Cl. .......................................... 716/10; 716/16
(58) Field of Classification Search ............ 716/16–17, 716/8, 10
See application file for complete search history.

(56) References Cited

U.S. PATENT DOCUMENTS

| | | | |
|---|---|---|---|
| 6,434,734 B1 * | 8/2002 | Zahar ........................... 716/12 |
| 6,735,755 B2 * | 5/2004 | Shau ............................ 716/16 |
| 7,093,225 B2 * | 8/2006 | Osann .......................... 716/19 |
| 2003/0131335 A1 * | 7/2003 | Hamlin ........................ 716/16 |
| 2004/0143797 A1 * | 7/2004 | Nguyen et al. ................. 716/1 |
| 2004/0243966 A1 * | 12/2004 | Dellinger ..................... 716/17 |
| 2005/0116738 A1 * | 6/2005 | Auracher et al. ............. 326/47 |
| 2006/0036988 A1 * | 2/2006 | Allen et al. .................. 716/17 |

OTHER PUBLICATIONS

U.S. Appl. No. 10/713,492, filed Nov. 14, 2003, McKenney et al.

* cited by examiner

*Primary Examiner*—Stacy A Whitmore
(74) *Attorney, Agent, or Firm*—Westman, Champlin & Kelly, P.A.

(57) ABSTRACT

Base platforms customizable into ICs are designed by identifying a plurality of macros for placement on the platform, each macro being defined in part by a plurality of elements that perform respective functions of the macro. Identical elements in a plurality of macros are identified, and a common element is placed on the platform for an identical element of at least two macros. All other elements of the macros are placed at locations on the platform relative to the common element as to satisfy macro placement rules for each macro. Identical elements can be identified by identifying similar elements in a plurality of macros, and creating a common element generic to the similar elements. The user designs a metalization layer to select macros and configure common elements to the selected macros.

20 Claims, 3 Drawing Sheets

PROCESS FOR DESIGNING BASE PLATFORMS FOR IC DESIGN TO PERMIT RESOURCE RECOVERY AND FLEXIBLE MACRO PLACEMENT, BASE PLATFORM FOR ICS, AND PROCESS OF CREATING ICS

FIELD OF THE INVENTION

This invention related to design of integrated circuits (ICs), and particularly to designing base platforms for integrated circuit design, and particularly to ASIC design.

BACKGROUND OF THE INVENTION

While the present invention will be described with particular reference to application specific integrated circuits (ASICs), the concepts are applicable to field programmable gate arrays (FPGAs) and to configurable logic blocks (CLBs) therein.

Integrated circuits are used in a wide range electronic devices produced by a large number of device manufacturers. In practice, ICs are seldom manufactured (fabricated) by the electronic device manufacturer. Instead, ICs are manufactured by an IC foundry to the specifications of the electronic device manufacturer. More particularly, the IC foundry supplies the technology to fabricate the IC and the device manufacturer supplies the intellectual property incorporated in the circuit of the IC being fabricated. Thus the IC design is often the result of corroboration between the device manufacturer and the IC foundry.

To reduce the time and cost of development of ASICs, IC foundries have developed base IC platforms using semiconductor wafers, sometimes called "slices," containing layers of semiconductor, such as silicon layers, but without metal interconnection layers. Hardmacs are diffused into the semiconductor layers by permanently embedding transistors and other electronic elements into the wafer layers to achieve specific functions for the ICs. Examples of diffused elements include memories, transceivers, processors, etc. The diffused elements are optimally arranged in groups on the platform that, when properly configured, operate together to perform a particular function, as defined by a macro. The grouping of diffused elements is usually governed by prescribed macro placement rules, with each macro being defined by a plurality of gates and one or more diffused elements. The platform also includes an array composed of pre-diffused transistors, sometimes called the "transistor fabric," arranged in a grid pattern.

The user selects a platform containing required groups of gates and elements that, when configured to macros, meet the user's requirements for an ASIC. Using tools supplied by the IC manufacturer, the user defines one or more metalization layers that interconnect the diffused elements and associated transistors, thereby creating required macros. These metalization layers also interconnect the transistors to configure them into logical gates. Hence, the user creates the custom ASIC, sometimes called a structured ASIC, by designing the metal interconnect layers to interconnect and configure the macros and gates. The macros do not actually exist on the platform until selected by the user and configured by the metalization layer(s).

There is a wide range of types of ICs. Consequently, foundries provide families of base platforms to perform various functions, with members of the families providing specific sets and arrangements of diffused elements. The user selects a base platform to configure into a custom ASIC best meeting the user's needs. Each platform contains diffused elements at locations so that macros can be created to accommodate the designs for a large number of customers and a large number of different ASICs. The user, using tools supplied by the IC foundry, designs one or more metalization layers for the base platform to interconnect the transistors and diffused elements to create the custom ASIC. In doing so, the user selects groups of diffused elements and associated transistors that form specific macros, creates those macros with the metalization layer, and couples the macros to other logic functions and macros through the metalization layers. Examples of such configurable base platforms are the RapidChip® slices available from LSI Logic Corporation of Milpitas, Calif. The RapidChip slices permit the development of complex, high-density ASICs in minimal time with significantly reduced design and manufacturing risks and costs.

In practice, the user selects a platform that contains the needed elements for necessary macros and whose physical layout is similar to an ideal ASIC for the user's requirements. The user designs the metalization layers to select and create macros and logic gates for the circuit.

Usually, the selected platform also contains elements and gates for macros that are not usable in the completed ASIC design. For example, if the platform contains processor and arithmetic elements and an associated memory element arranged as a potential macro, but the user only requires the memory, the macro was selected for the memory but the arithmetic and processor elements were not used in the completed ASIC. In such a case, the arithmetic and processor elements, along with the associated transistors, remained unused on the chip. Thus the transistor fabric for the macro also was not available for use in the ASIC. As another example, if an ASIC required two macros, such as different processors requiring similar diffused elements, such as similar memories, both groups of elements representing both macros were configured, so that each processor had its own memory.

It is desirable to reduce the number of base platforms in a given family. Each base platform represents a considerable expenditure to design and support. Proliferation of base platforms to meet user requirements adds to the expense of the entire family and the tools to support it. Therefore, it is desirable to design base platforms as generic as practical to reach the requirements of a greater number of users and ASIC designs.

SUMMARY OF THE INVENTION

One embodiment of the present invention is a process of designing base IC platforms that are customizable into integrated circuits, such as ASICs or FPGAs. A plurality of macros are identified for placement on an IC platform. Each macro represents a sub-circuit for placement on the ASIC or FPGA, and each has elements, such as diffused elements in ASICs or CLB in FPGAs. Identical elements in a plurality of macros are identified. An identical element is placed on the platform as a common element for at least two macros. The placement is at a location on the platform suitable for inclusion of the macros. All other elements of the macros are placed at locations relative to the common element as to satisfy macro placement rules for each of the macros.

In some embodiments, the identical elements are identified by identifying similar elements in a plurality of macros, and creating common elements generic to at least some of the similar elements.

Another embodiment of the invention is a platform configurable to an integrated circuit having a plurality of gates and elements, at least some of the elements being common elements to plural macros. Connection points are coupled to the gates and elements so that a metalization layer can be added to configure common elements to specific elements for a selected macro and to configure the macros and circuit.

Yet another embodiment of the invention is a process of designing an integrated circuit by selecting an IC platform containing a plurality of gates and elements, at least one of the elements being a common element to at least two macros. Macros are selected for inclusion in the integrated circuit, and a metalization layer is designed to connect gates and elements into the selected macros, to selectively configure common elements for a selected macro, and to selectively include gates in the integrated circuit that are outside the selected macros and in regions on the platform that would otherwise be included in unselected macros that would contain an element common to a selected macro.

DETAILED DESCRIPTION OF THE PREFERRED EMBODIMENTS

Prior to the present invention, it has not been possible to employ a common diffused element that can be selectively applied to a plurality of macros so that upon selection of one of the macros, the common element is configurable for that macro. One aspect of the present invention is directed to designing a base platform in which elements are placed on the platform so that a common element is configurable to one of a plural macros while the position of all elements within each macro are defined in accordance with applicable macro placement rules. User selection of one of the plural macros into the design configures the common element to the selected macro and permits use of gates that would be otherwise dedicated to other macros so that such gates can be used for other purposes in the ASIC.

Figure 1:
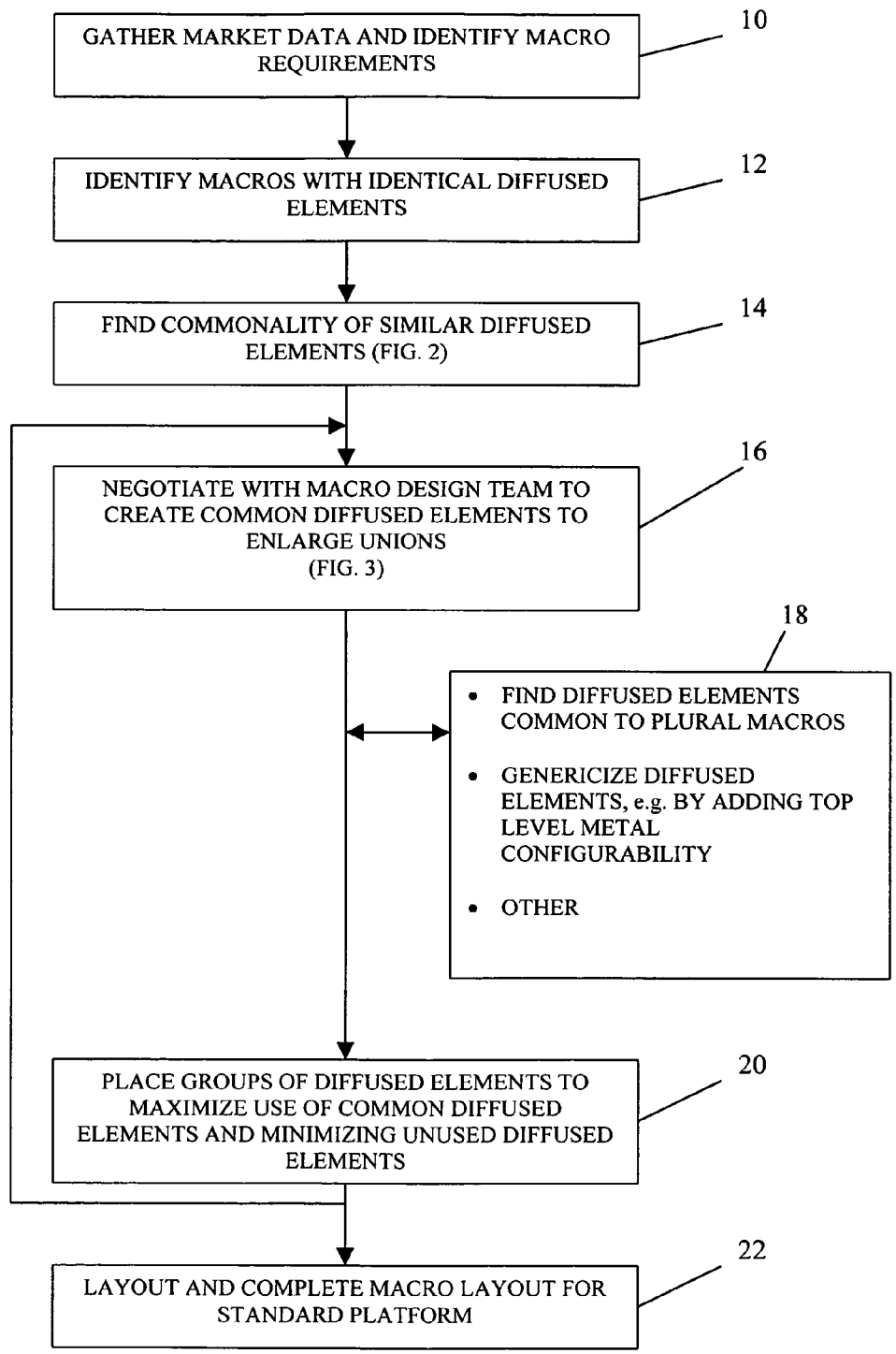
FIG. 1 is a flowchart of the process of designing base platform according to the present invention.

FIG. 1 is a flowchart of a process of designing base platforms for customization to ASICs by the user. The base platform under design in FIG. 1 is a base platform that is user-configurable to a custom ASIC. More particularly, the user can design metal interconnection layers to connect transistors of the base platform and selectively utilize macros based on diffused elements imbedded into the base platform, some of which are common to plural macros, to thereby design the custom ASIC. Using the base platform according to the present invention, the user is able to flexibly create macros using common diffused elements to efficiently meet the user's needs and to recover use of gates in the ASIC that would have otherwise been assigned to unused macros sharing a common diffused element.

The process begins at step 10 with the conduct of market surveys or otherwise gather market information as to the requirements of users in custom ASICs. The specific manner of gathering market data is not material to the invention, as different organizations employ different techniques, both formal and informal, to gather such data. While the data gathered might not identify specific types of macros required by a given user, the data will reflect circuit requirements and specifications from which the base platform designer can identify specific types of macros required by various customers, as well as the use of such macros. Based on the use for the completed ASIC, the platform designer is able to identify needed macros and identify locations for macros on the platform under design.

The macros themselves are ordinarily designed by separate teams of macro designers. Prior to the present invention, macros were designed with a complete complement of diffused elements and assigned gates so that the macro, and its diffused elements and gates, could be used in the ASIC to meet the specific requirements of the user.

In the present invention, the macros are examined on a broader scale. More particularly, at step 12 macros are identified that require at least one diffused element that is identical to a diffused element in another macro.

Figure 2:
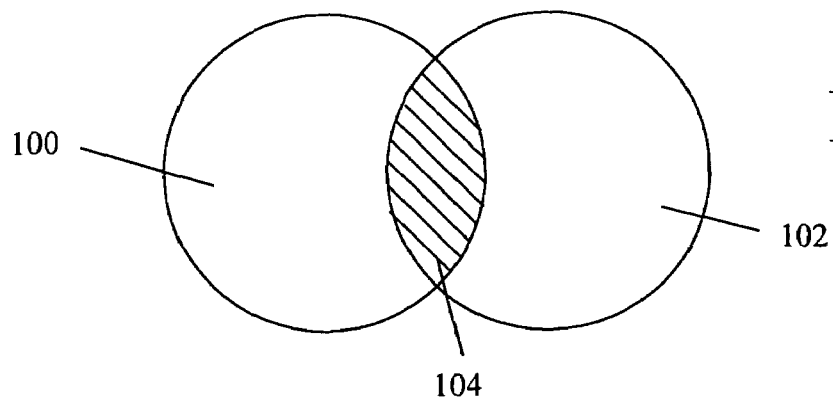
FIGS. 2 and 3 are illustrations useful in explaining portions of the process of FIG. 1.

At step 14 macros are identified that require at least one diffused element that is similar, but not identical, to a diffused element in another macro. The commonalities of the similar diffused elements are identified and examined to identify the extent to which the similar diffused elements are the same, and the extent that they are different. This relationship is diagrammatically illustrated in FIG. 2 where circles 100 and 102 represent different, but related, diffused elements having a low degree of commonality, represented by the common region 104. This is referred to as the union of diffused elements 100 and 102. It will be appreciated that a given platform contains numerous groups of diffused elements and transistors, each group being configurable to a macro. Consequently, the unions of plural diffused elements may be numerous.

Figure 3:
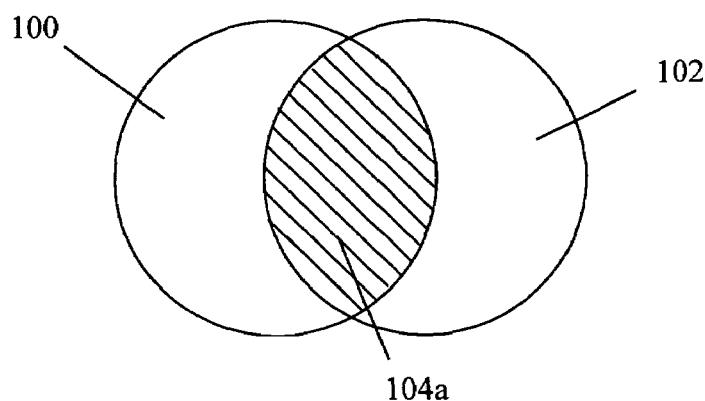

At step 16 the goal is to increase the union 104 to 104a between any given two similar diffused elements, and to increase the number of unions (commonality) between diffused elements, as diagrammatically illustrated in FIG. 3.

At step 16, the macro teams negotiate to refine the diffused elements. Here, the goal is to enlarge individual unions, bring additional macros into a given union and increase the number of unions. In carrying out step 16, the extent that the similar diffused elements are different is examined with the view that diffused elements might be genericized by adding size or function, coupled with ports so that they might by configured by metal interconnections at a metalization layer to configure the diffused element for use in one or another macro.

At step 16, a common element is created that is generic to plural similar elements. Connections are made to the common element allowing it to be configured into one or another of the similar elements, based on the user selection of macros.

Step 16 considers several possible actions to enlarge unions, some listed at block 18 in FIG. 1. One is to find the identical diffused elements amongst plural macros. The genericization of diffused elements might be increased by adding gates and/or size to the element for given applications and by adding connection points, such as to meet a largest similar element, for connection to metal traces at the top level metalization layer.

Figure 4:
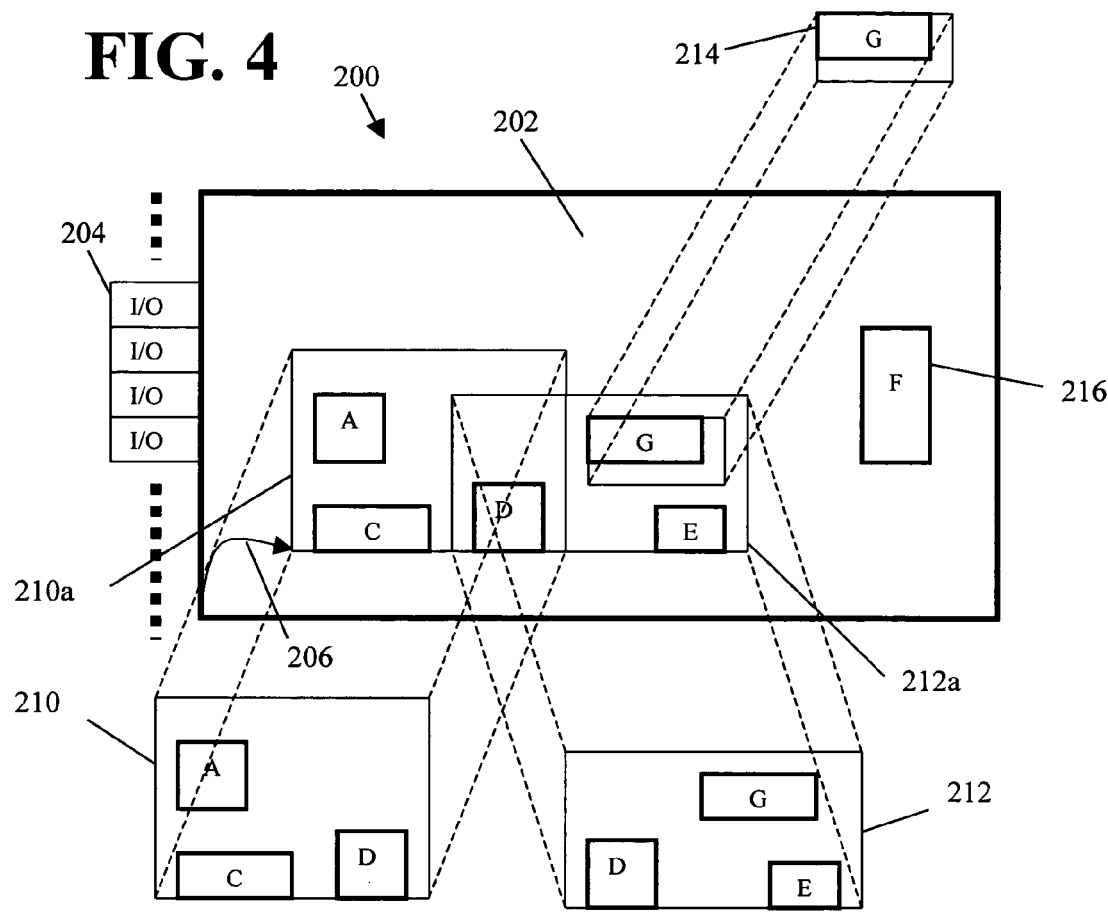
FIGS. 4 and 5 are plan diagrams illustrating portions of a base platform according to the present invention and useful in explaining portions of the process of FIG. 1.

At step 20, different elements, including identical and genericized diffused elements, are placed into proximity in accordance with macro placement rules for plural macros, with overlapping regions containing one or more common diffused elements. The common diffused element is a diffused element that has been identified at step 12 as an identical diffused element to the plural macros, or genericized at step 16 from similar diffused elements in the plural macros. In some cases, a first macro might be placeable within the region of a second, larger macro so that the common diffused element might serve one purpose to the first macro and a different purpose to the second macro. Various cases of overlapping macro regions and regions within regions are illustrated in FIG. 4. Suffice it to say, at step 20 the goal is to maximize the use of diffused elements and minimize the occurrence of unused diffused elements when the platform is customized for various uses.

As shown in FIG. 1, the negotiations to enlarge unions in numbers and in size (step 16 and block 18) and the placement into overlapping macro regions (step 20) is an iterative process, repeated until the teams and platform designer are satisfied that the platform is likely to meet the needs of a largest possible number of users and uses based on the market data. At step 22 the diffused elements are embedded in the platform at locations useful for the macros that share the common diffused elements. The placement of diffused elements of a given macro is governed by the applicable macro placement rules. A common diffused element, therefore, must satisfy the macro placement rules for all macros to which it is common. As explained in conjunction with FIG. 5, the diffused elements are placed with reference to a specific point in each macro. When the user selects (places) a macro on the platform by connecting the elements and gates of the macro with the custom metalization layer, the placement of the macros are defined with reference to a point on a grid array for the platform.

FIG. 4 illustrates a base platform layout 200 having a core 202 that contains gates and macros arranged in a grid array, and input/output channels 204. The grid array, shown partially in FIG. 5, defines x-y coordinates for each location on the grid. In the design of platform 200, macros 210, 212, 214, and 216 are selectively placeable at positions 210$a$, 212$b$, etc. on the platform identified by x-y coordinates on the array, as illustrated by positioning arrow 206 in relation to macro 210$a$.

Diffused elements A, C and D are arranged in a group to define macro 210. In practice, there may be any number of diffused elements for a given macro, but for purposes of explanation only three are illustrated in macro 210. Diffused elements D, E and G are in a group that defines macro 212. In this example, element D is common to macros 210 and 212. Thus, element D either was found to be identical to macros 210 and 212 at step 12 (FIG. 1) or it was genericized for similar elements at step 16. For example, diffused element D might be a processor which is configurable to operate in macro 210 with diffused elements A and C, or it may be configurable to operate in macro 212 with diffused elements E and G.

It will be appreciated to those skilled in the art that the macros are not actually embedded in the platform and do not exist until they are created by the top metalization layer, to be added by the user design. Instead, only the diffused elements exist, and are placed in respect to each other in accordance with the macro placement rules for macros 210 and 212. Thus, the configuration of diffused element D to macro 210 or 212 is performed at the top metalization layer during customization by the user.

The common diffused element D is ordinarily configurable to only one macro. Thus, if the top level metalization layer configures diffused element D to macro 212, macro 210 does not exist, and diffused elements A and C might not be used in the customized ASIC. In some cases, diffused elements A and/or C might be used for other purposes, but not in macro 210. Moreover, some macros might employ several common diffused elements. For example, if elements A and G are similar memories, diffused elements A or G might be genericized and placed on the platform as a single memory configurable to both macros 210 and 212.

Another example of a common diffused element is diffused element G which is common to macros 212 and 214. Macro 214 may be a test wrapper for the memory element G as a stand-alone memory. In this case, element G may be configured as a stand-alone memory with test wrapper in macro 214 (in which case macro 212 would not be available in the ASIC) or it may be configured as a memory for macro 212, in which case the test wrapper of macro 214 is not available. Element G might also be a memory for macro 210 if configurable to macro 210 and placed in a common area with macros 210 and 212 according to the placement rules for both macros.

The placement of diffused elements in a macro is established in accordance with placement rules for each macro, and to meet placement requirements for common diffused elements. Placement of the macros is established to meet the macro requirements using the common diffused elements.

Figure 5:
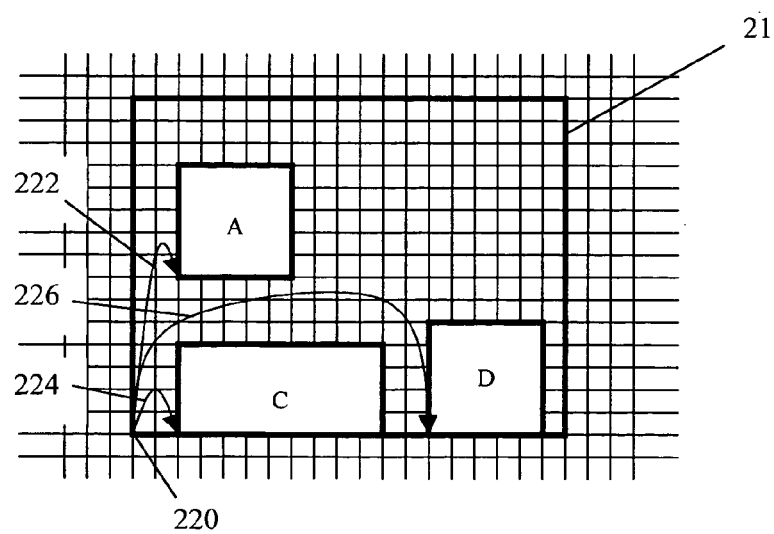

FIG. 5 illustrates the placement of macro 210 at position 210$a$. The grid array is represented by horizontal and vertical lines, the intersections of which represent unique x and y coordinates that designate the position of macros, elements and gates on platform 200. Because macro 210 extends over several grid lines, the position of the macro is identified by the x-y coordinates of a predetermined point on the macro, such as point 220 at the bottom left corner of the macro. Ordinarily, the positions of other macros are identified by similar predetermined points on the respective macros. The locations of diffused elements A, C and D are placed in accordance with macro placement rule in relation to a predetermined point on the macro, such as point 220, as shown by arrows 222, 224 and 226, respectively.

In a similar manner, the position of the other macros are established on the grid array and the position of those macro's diffused elements are established in accordance with the macro placement rules.

Figure 6:
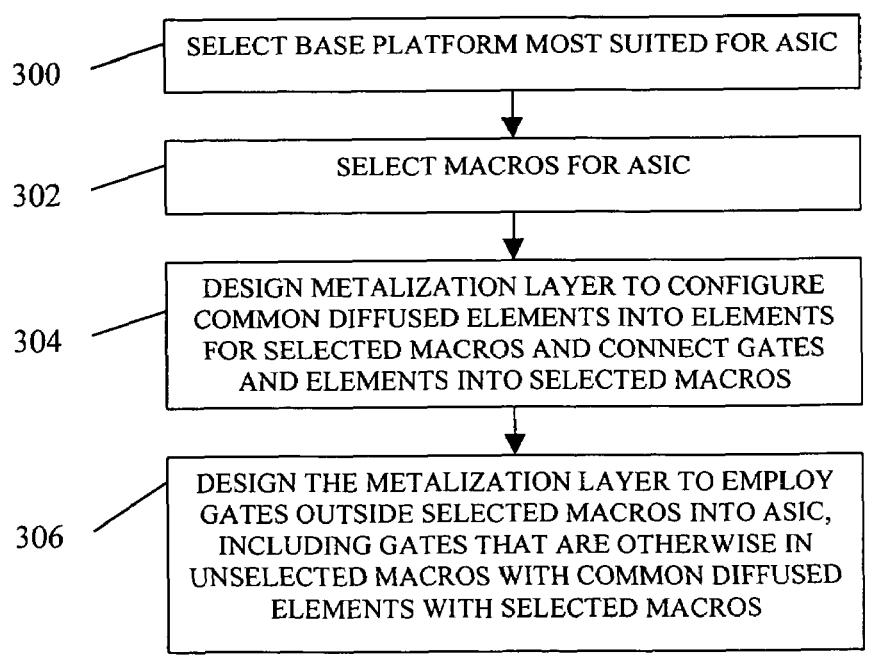
FIG. 6 is a flowchart of the process of using the base platform according to the present invention.

FIG. 6 is a flowchart of a process of using the platform shown in FIG. 4 to create a custom ASIC. At step 300 a base platform according to the present invention is selected that meets, usually in excess, the requirements for the ASIC under design. Using the same considerations in selecting present base platforms, a platform is selected that, when customized according to the present invention, will meet the requirements of the user. At step 302, the macros are selected, and at step 304 an initial design of the metalization layer is created.

More particularly, at step 304, connections to the common diffused elements, such as element D in FIG. 4, are interconnected at the metalization layer so that the common element D is configured to the requirements of the selected one of macros 210 or 212 (FIG. 4). Additionally at the step 304, the elements and gates are interconnected to form the sub-circuit of the selected macro in a manner well known in the art.

At step 306, the ASIC is completed by connecting gates outside of selected macros, including in the area of unselected macros, such as macro 212, that otherwise would contain common elements selected for a different macro. In preferred embodiments, this is performed by simple exclusion of macro 212 from use, allowing gates otherwise designed for macro 212 to be used for other purposes as well known in the art.

One feature of the invention is that the gates within macros not selected for use in the customized ASIC are available for other uses within the ASIC, as if the unused macros were not present. In the example of FIG. 5 where macro 210 is configured into the ASIC by top level metalization, macro 212 could not be selected. Consequently, resources otherwise devoted to unused macros, such as macro 212, are available for use within the ASIC.

Another feature of the invention is the ability to create new macros after the base platform is created by re-configuring one or more common diffused elements and/or configuring a common diffused element to a different macro.

The present invention is also useful for management of macros in platforms having nesting areas into which predesigned or custom processors may be placed, as describe in U.S. patent application Ser. No. 10/713,492 filed Nov. 14, 2003 for "Flexible Design for Memory Use in Integrated Circuits" by Douglas J. McKenney and Steven M. Emerson and assigned to the same assignee as the present invention, the content of which is hereby incorporated by reference in its entirety. Using the techniques of the present invention with those specifically taught in the McKenney application, flexibility of platforms is greatly increased, adding to the efficiency of the IC.

While the invention has been described in connection with using diffused elements in an array, the concepts described herein may be extended to CLBs in FPGAs with special elements.

Although the present invention has been described with reference to preferred embodiments, workers skilled in the art will recognize that changes may be made in form and detail without departing from the spirit and scope of the invention.

What is claimed is:

1. A process of designing base IC platforms that are customizable into integrated circuits comprising steps of:
    a) identifying macros for placement on an IC platform, each macro representing a sub-circuit for placement on the an integrated circuit, at least some of the macros being defined at least in part by a plurality of elements that perform respective functions of the associated macro;
    b) identifying identical diffused elements in a plurality of the macros;
    c) placing one of the identical diffused elements as a common element of at least two of the plurality of macros at a location on the platform suitable for inclusion within the at least two macros; and
    d) placing other elements of the at least two macros at locations on the platform relative to the common element as to satisfy macro placement rules for each of the at least two macros.

2. The process of claim 1, wherein step (b) further comprises steps of:
    b1) identifying similar diffused elements in a plurality of the macros, and
    b2) creating a common diffused element generic to at least some of the similar elements.

3. The process of claim 2, wherein the step of identifying similar elements comprises:
    identifying similar elements as ones performing the same function in similar manners.

4. The process of claim 3, wherein the step of creating common elements comprises:
    performing one or more steps selected from the group comprising adding gates to one or more of the at least two macros and altering the size of the element to meet a largest sized similar element.

5. The process of claim 2, wherein the step of creating common elements comprises:
    performing one or more steps selected from the group comprising adding gates to one or more of the at least two macros and altering the size of the element to meet a largest sized similar element.

6. The process of claim 2, wherein step b) further comprises:
    b3) providing connection points to the common elements so that connection points can be connected to selectively configure the common elements to perform functions for a selected macro in the same manner as the respective similar element of that macro.

7. The process of claim 6, wherein the step of identifying similar elements comprises:
    identifying similar elements as ones performing the same function in similar manners.

8. The process of claim 7, wherein the step of creating common elements comprises:
    performing one or more steps selected from the group comprising adding gates to one or more of the at least two macros and altering the size of the element to meet a largest sized similar element.

9. The process of claim 6, wherein the step of creating common elements comprises:
    performing one or more steps selected from the group comprising adding gates to one or more of the at least two macros and altering the size of the element to meet a largest sized similar element.

10. The process of claim 1, further comprises
    e) defining a grid on the platform, and
    wherein steps c) and d) comprise identifying the location of the elements placed in steps c) and d) on the platform by coordinates on the grid.

11. The process of claim 10, wherein step (b) comprises steps of:
    b1) identifying similar diffused elements in a plurality of macros, and
    b2) creating common diffused elements generic to at least some of the similar elements.

12. The process of claim 11, wherein the step of creating common elements comprises:
    identifying similar elements as ones performing the same function in similar manners.

13. The process of claim 12, wherein the step of creating common elements comprises:
    performing one or more steps selected from the group comprising adding gates to one or more of the at least two macros and altering the size of the element to meet a largest sized similar element.

14. The process of claim 11, wherein the step of creating common elements comprises:
    performing one or more steps selected from the group comprising adding gates to one or more of the at least two macros and altering the size of the element to meet a largest sized similar element.

15. The process of claim 11, wherein step b) further comprises:
    b3) providing connection points to the common elements so that connection points can be connected to selectively configure the common elements to perform functions for a selected macro in the same manner as the respective similar element of that macro.

16. The process of claim 15, wherein the step of creating common elements comprises:
    identifying similar elements as ones performing the same function in similar manners.

17. The process of claim 15, wherein the step of creating common elements comprises:
performing one or more steps selected from the group comprising adding gates to one or more of the at least two macros and altering the size of the element to meet a largest sized similar element.

18. The process of claim 1, wherein step (a) comprises:
gathering market data concerning macro requirements.

19. An IC platform configurable to a custom integrated circuit comprising:
a plurality of diffused elements positioned on a platform, at least some diffused elements being configurable into a plurality of macros that serve as sub-circuits such that the elements perform respective functions of the respective macro, at least one of the diffused elements being a common element to at least two of the plurality of macros, the other diffused elements of each of the at least two macros being at locations on the platform that satisfy macro placement rules for each of the at least two macros;
connection points coupled to the diffused elements for connection to at least one metalization layer;
whereby the least one metalization layer configures each of the at least two macros by selective connection of the diffused elements, including the at least one common element, on the at least one metalization layer, thereby rendering all diffused elements available for use in an integrated circuit that are outside the configured macro and in a region on the platform that would otherwise be assigned to other macros also containing the common element.

20. A process of designing an integrated circuit, comprising steps of:
a) selecting an IC platform containing a plurality of diffused elements, at least some diffused elements being configurable into a plurality of macros that serve as sub-circuits of the integrated circuit such that the diffused elements perform respective functions of the respective macro, at least one of the diffused elements being a common element to at least two of the plurality of macros, the other diffused elements of each of the at least two macros being at locations on the platform that satisfy macro placement rules for each of the at least two macros, and connection points coupled to the diffused elements for connection to a metalization layer;
b) selecting macros for inclusion in the integrated circuit;
c) at least one metalization layer definition, which to connect a plurality of connection points and connect at least some of the diffused elements into the selected macros, the at least one metalization layer definition selectively configuring common elements for the respective selected macro, and
d) creating the at least one metalization layer definition to selectively include diffused elements in an integrated circuit that are outside the selected macros and in regions on the platform that would otherwise be assigned to unselected macros that would contain a diffused element common to a selected macro.

\* \* \* \* \*